United States Patent [19]

Pfender

[11] Patent Number: 4,818,837

[45] Date of Patent: Apr. 4, 1989

[54] MULTIPLE ARC PLASMA DEVICE WITH CONTINUOUS GAS JET

[75] Inventor: Emil Pfender, St. Paul, Minn.

[73] Assignee: Regents of the University of Minnesota, Minneapolis, Minn.

[21] Appl. No.: 88,610

[22] Filed: Aug. 24, 1987

Related U.S. Application Data

[60] Division of Ser. No. 817,759, Jan. 6, 1986, Pat. No. 4,725,447, which is a continuation of Ser. No. 655,340, Sep. 27, 1984, abandoned.

[51] Int. Cl.[4] .............................................. B23K 9/00
[52] U.S. Cl. .......................... 219/121.51; 219/121.48; 219/121.52; 219/121.47; 219/121.36; 427/34
[58] Field of Search .................. 219/121 PQ, 121 PR, 219/121 PP, 121 PM, 121 PV, 121 P, 74, 75, 76.16, 121 PL; 427/34, 37; 313/231.31, 231.41

[56] References Cited

U.S. PATENT DOCUMENTS

| | | | |
|---|---|---|---|
| 3,197,810 | 8/1965 | Bildstein | 18/1 |
| 3,313,908 | 4/1967 | Unger et al. | 219/76 |
| 3,496,280 | 2/1970 | Dukelow et al. | 13/9 |
| 3,573,090 | 3/1971 | Peterson | 117/93.1 |
| 3,798,408 | 3/1974 | Foex et al. | 219/121 PR |
| 3,894,573 | 7/1975 | Paton et al. | 219/121 PR |
| 3,931,542 | 1/1976 | Sheer et al. | 219/121 PR |
| 3,980,802 | 9/1976 | Paton et al. | 13/18 |
| 3,989,512 | 11/1976 | Sayce | 75/11 |
| 4,121,083 | 10/1978 | Smyth | 219/76.16 |
| 4,141,694 | 2/1979 | Camacho | 48/61 |
| 4,206,190 | 6/1980 | Harvey, II et al. | 423/344 |
| 4,297,388 | 10/1981 | Kumar et al. | 427/34 |

OTHER PUBLICATIONS

Harry, J. E. et al., "Production of a Large Volume Discharge Using a Multiple Arc System", *IEEE Transactions on Plasma Science*, vol. PS-7, No. 3, Sep. 1979, pp. 157-162.

Harry, J. E. et al., "Simultaneous Operation of Electric Arcs from the Same Supply", *IEEE Transactions on Plasma Science*, vol. PS-9, No. 4, Dec. 1981, pp. 248-254.

Sheer, C. et al., "Invited Review: Development and Application of the High Intensity Convective Electric Arc", *Chemical Engineering Communications*, vol. 19, pp. 1-47 (1982).

Harry, J. E. et al., "Power Supply Design for Multiple Discharge Arc Processes", Sixth International Symposium on Plasma Chemistry, Symposium Proceedings, Vol. 1, pp. 150-155 (1983).

Pickles, C. A. et al., "The Behaviour of Minor and Trace Elements in Coal in An Argon Plasma", *High Temperature Technology*, vol. 2, No. 1, Feb. 1984, pp. 15-21.

Whyman, D., "Rotating-wall, d.c.-Arc Plasma Furnace", J. Sci. Instrum. 1967, vol. 44, pp. 525-530.

Bryant, J. W. et al., "A Cathode Assembly for Feeding Powders into the Plasma of Expanded d.c. Arcs", *Journal of Scientific Instruments* (Journal of Physics E) 1969, Series 2, vol. 2, pp. 779-781.

"Arc-plasma dissociation of Zircon", *Chemical Engineering*, Nov. 24, 1975 (author unknown).

Hamblyn Ph.D., S.M.L., "Plasma Technology and its Application to Extractive Metallurgy", *Minerals Science Eng.*, vol. 9, No. 3, Jul. 1977, pp. 151-176.

Maddever, W. J. et al., "The Influence of Electrode Gas Injection on Arc Furnace Steelmaking", *Iron and Steelmaker*, Nov. 1977, pp. 33-41.

*Primary Examiner*—M. H. Paschall
*Attorney, Agent, or Firm*—Kinney & Lange

[57] ABSTRACT

A multiple cathode DC arc plasma generator arrangement is used in connection with a single anode for thermal arc plasma processing of materials. A nozzle is provided to introduce a gas in approximately the center of the multiple cathodes, towards the anode. The nozzle injects the gas into the center of the plasma column generated between the cathodes and anode to stabilize such arc and affect the self-induced electrode jets. This provides control of the heat transfer to the anode and permits feeding of particulate matter into the core of the plasma column to enhance inflight processing (melting and/or chemical reaction) of the matter. A set of gas nozzles positioned radially about the anode may be employed for feeding of particulate matter at the anode surface.

10 Claims, 4 Drawing Sheets

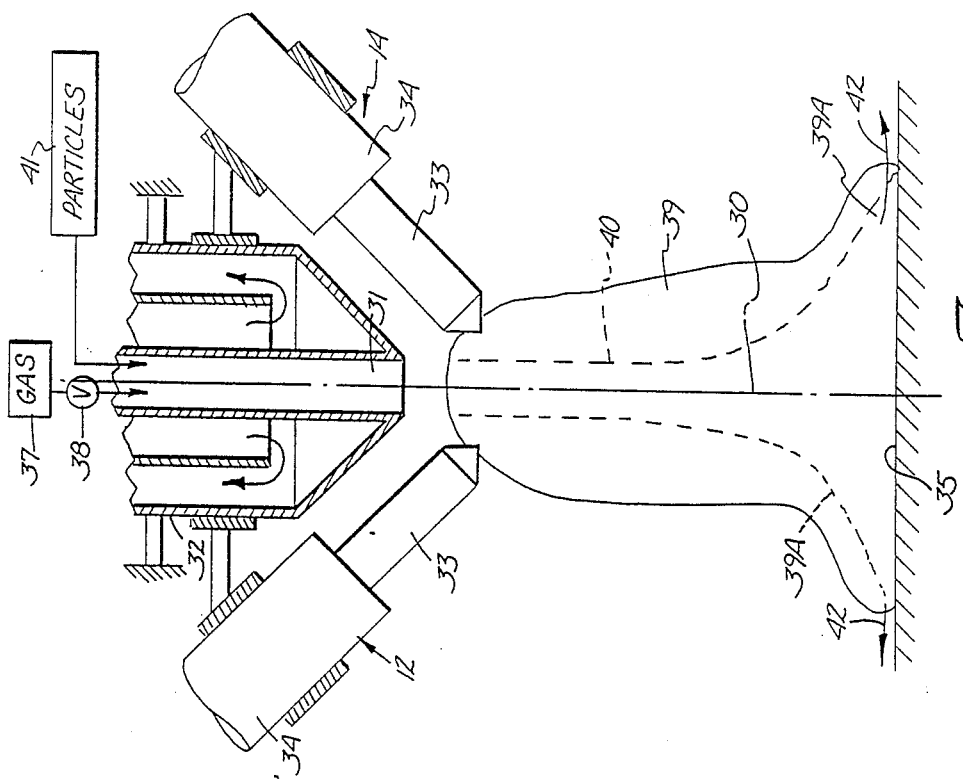
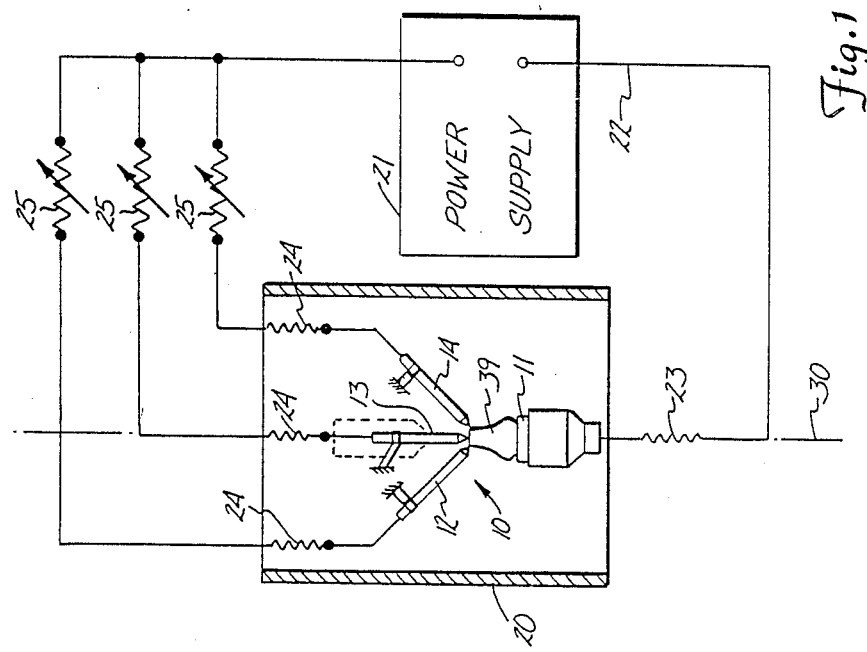
Fig.2
Fig.1

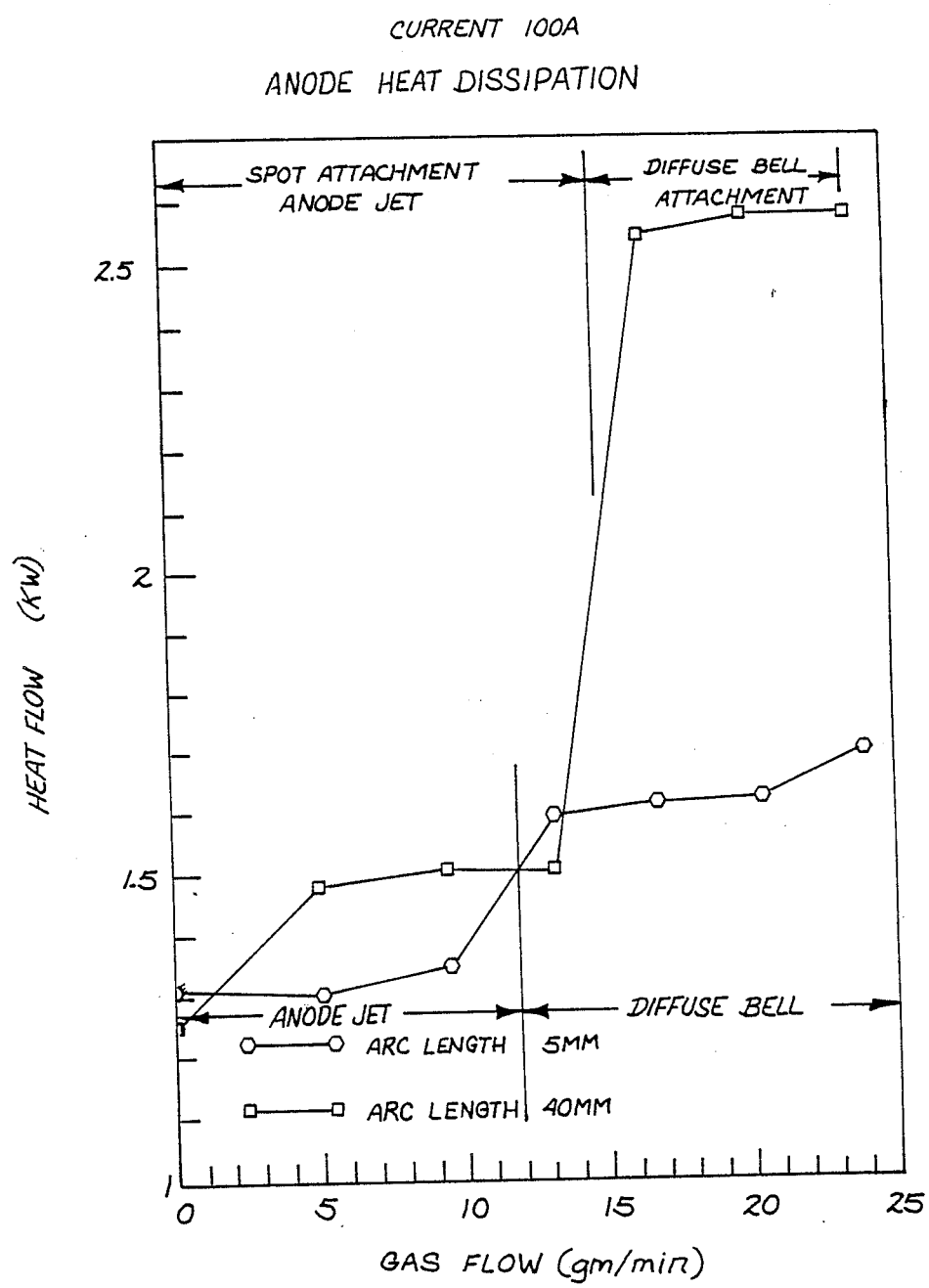

MULTIPLE ARC PLASMA DEVICE WITH CONTINUOUS GAS JET

This invention was made with Government support under Grant Number CPE 82-00628 awarded by the National Science Foundation. The Government has certain right in this invention.

CROSS REFERENCE TO RELATED APPLICATION

This application is a division of application Ser. No. 08/817,759, filed Jan. 6, 1986, and now U.S. Pat. No. 4,725,447, which application in turn was a continuation of application Ser. No. 655,340, filed Sept. 27, 1984, now abandoned.

BACKGROUND OF THE INVENTION

1. Field of the Invention

The present invention relates to continuous plasma processing of materials, and more particularly to an apparatus and method for plasma processing which utilizes a gas injected in the center of a coalesced plasma column for obtaining desired heat transfer to the anode and/or particulate material processing.

2. Description of the Prior Art

Thermal plasmas, formed by arcs between a cathode and an anode, generate high temperatures and have an extremely active nature, and thus have attracted the interest of metallurgists and chemical synthesists for years. High intensity arcs are used for welding, cutting, plasma spraying, lighting, interrupting high power circuits, melting and alloying, and producing ultra fine refractories in the form of particulate material. It is known that arc induced magnetohydrodynamic effects dominate a high intensity arc. Interaction of the arc current with the self magnetic fields gives rise to a pumping action, inducing jets or gas flows called a cathode jet and an anode jet. The action of such induced gas flows depends on the gap between the cathode and anode and on the current strength, and can substantially affect the total heat transfer to the anode.

The present invention uses a multiple arc system, in the preferred form. In conjunction with the multiple arc system known electrical circuity is used as explained in an article by J. E. Harry and R. Knight entitled "Simultaneous Operation of Electric Arcs From The Same Supply", IEEE Trans Plasma Science, PS. 9(4) pp. 248-254 (1981), and also in an article "Power Supply Design For Multiple Discharge Arc Processes", published in the 6th International Symposium on Plasma Chemistry, Symposium Proceedings, Volume 1, pp. 150-155 (1983).

Yet, problems persist in establishing a stable, coalesced DC arc using multiple cathodes and/or plasma torches, that can be controlled to (1) permit injection of particulates into the plasma region for processing and permit ejection of these particles radially outwardly at a position spaced from the anode and (2) control anodal heating. (As used herein, "plasma torch" shall mean a device consisting of a thin stick-type cathode surrounded by a tube shaped anode with a nozzle at one end. When suitable electric power is supplied to a plasma torch, a jet of plasma is emitted from the opening of the nozzle.) Problems with heat dissipation over the surface of the anode also continue to exist. It is desirable to prevent localized extremely high temperature spots on the anode because hot spots cause detrimental evaporation of the anode material. Even when liquid cooled anodes are utilized, evaporation is a problem.

The Harry articles referred to above describe use of a plurality of cathodes spaced about a central axis for generating arcs in which plasma is formed, and U.S. Pat. No. 3,989,512, issued Nov. 2, 1976 to Sayce also describes a plurality of separate nontransferred arc plasma torches arranged in spaced relation around a central axis for generating a column of plasma.

Background on plasma technology is also given in the article entitled "Plasma Technology And Its Application To Extractive Metallurgy" by S. M. L. Hamblyn, Mineral Science Engineering, SCI. Engng, Vol. 9, No. 3, pp. 151-176 (July 1977).

On Page 153 of the Hamblyn article, in FIGS. 6 and 7, there is a three phase (AC) plasma system stabilized by using a direct current supply. The arrangement forms a central plasma stream, and it is indicated that the device had a central gas flow along the plasma stream, to produce a homogeneous volume of plasma. The system was used mainly for experimental studies of heat transfer to refractory oxide in a fluidized bed reactor. The device in this article does not provide for a coalesced DC arc, such as is obtained with the three cathodes utilized with the present device, nor does it teach the use of a gas stream for stablizing the arcs, and/or material particle injection and processing.

Additional work is set forth in the article of C. Sheer et al entitled "Invited Review: Development And Application Of The High Intensity Convective Electrical Arc", Chem. Eng. Comm. Vol. 19, pp. 1-47 (1982), and in particular pages 17-27 include an explanation of a "cathode pump" that forms near a cathode tip. A single cathode is disclosed and in the article it is taught that particulate matter being introduced into the plasma is to some extent injected into the plasma, but for the most part travels in the fringes of the plasma, and thus the high temperature plasma core which is useful for processing is not fully utilized.

An additional patent which illustrates the general state of the art in plasma arc production of silicon nitride is Harvey et al. U.S. Pat. No. 4,206,190, issued June 3, 1980. This describes a plasma arc furnace used for forming particulate silicon nitride.

Arc plasma dissociation of zircon is described in an article by that title in Chemical Engineering, Nov. 24, 1975. This just shows general applications of plasma technology.

Additional patents which illustrate use of plasma arcs and/or plasma generators are as follows:

| U.S. Pat. No. | Inventor | Date of Issue |
|---|---|---|
| 3,313,908 | R. Unger et al | 04-11-67 |
| 3,496,280 | D. Dukelow et al | 02-17-70 |
| 3,573,090 | J. Peterson | 03-30-71 |
| 3,980,802 | B. Paton et al | 09-14-76 |
| 4,121,083 | R. Smyth | 10-17-78 |
| 4,141,694 | S. Camacho | 02-27-79 |
| 4,426,709 | J. Fegerl et al | 01-17-84 |

Although multiple cathode plasma generators are known in the prior art, several problems persist: (1) lack of stability of the plasma column and a tendency for the column to randomly dance across the anode surface; (2) localized hot spots on the anode surface that cause unwanted evaporation of the anode; (3) maintaining high heat flows to the anode without unwanted hot spots; (4) difficulty in overcoming the viscosity and thermal gradient effects of the plasma to inject particulate matter into the plasma for processing; and (5) maintaining particulate matter within the plasma for sufficient times to ensure efficient and complete processing. It is to the solution of these problems that this invention is directed.

SUMMARY OF THE INVENTION

A multiple source plasma generator arrangement, as shown by a multiple cathode arrangement, has the plasma creating members positioned about a central axis. A gas nozzle is centered along the axis for feeding inert or reactive gases and/or particulate material from the top of the device downward toward the target surface. In the case of a multiple cathode arrangement, the location of the gas nozzle would be in the area in which the multiple cathodes are located and the nozzle would be directed downward toward the anode. In a preferred form, the multiple arc arrangement is DC driven to provide a coalesced arc formed plasma column, and a flow of inert gas from the nozzle is directed through the column along its axis to enhance stability of the arc and to provide a means for continuous feeding of particulate matter into the plasma core for controlled processing of materials.

While it is well known that there is a self-induced pumping action (the cathode and anode jets described above) derived in the use of arcs generating plasma, the forced flow of gas in the present device in direction from the cathodes toward the anode strongly affects the plasma flow. In the first embodiment of this invention, controlling the flow of the forced gas results in the creation of a bell shaped arc that has a substantial area of contact with the anode to provide enhanced heat transfer to the anode without creating localized hot spots.

Additionally, the forced flow of gas from the central nozzle may be used as a means for injecting particulate material into the core of the multiple arcs so that inflight processing, such as melting and/or chemical reactions of the materials, is confined within the plasma. This results in higher processing efficiencies, and better control over the operations.

A second embodiment comprises use of the invention as an arc plasma reactor through utilization of the interaction between forced gas flows and self-induced gas flows that are created in this type of device. The forced gas flows are externally applied convective gas flows in either or both the areas of the anode or cathodes. The self-induced flows are an electromagnetic pumping effect of gas from the cathode to the anode, called a cathode jet, and from the anode to the cathode, called an anode jet. Through utilization of the interaction of these self-induced and forced flows, plasma processing can be enhanced, for example, for making fine powders from a variety of injected particulate material. The forced flow from the cathodes toward the anode, augmented by the cathode jets, may be used to counteract the anode jet and form a stagnation layer at a level between the cathodes and the anode. The stagnation region represents a region of high plasma temperature and relatively low gas velocities, which is ideally suited for plasma processing of particulate material. As will be shown, particulate material carried by the forced gas flows is entrained in the high temperature plasma and maintained in the stagnation region for a relatively long period of time to enhance proper formation of the process products. The processed particulate material is then discharged from the arc region laterally outwardly and can impinge against the sides of a furnace for collection. The forced gas can be inert or a reactant for processing the particulate material.

In both embodiments of the invention, the interaction of the self magnetic fields of the arc leads to a coalescence of the individual arcs into a single arc column. The coalescence occurs at some distance from the cathodes, so cathode-anode spacing is controlled to insure such coalescence. By proper regulation of the forced gas flow, the stagnation layer will be at a location after the arcs have coalesced, and in a region which provides enhanced material processing.

While a similar stagnation effect can be realized from a single cathode using a single arc, it does not have the advantage of enhanced particle entrainment due to the off-axis temperature peaks produced as a result of the multiple cathode geometry. The multiple cathode arrangement provides for enhanced processing of particles.

The combination of forced gas flows and the anode and cathode jets, and the interaction of these flows, gives substantially better processing results and efficiencies than those heretofore obtained.

BRIEF DESCRIPTION OF THE DRAWINGS

FIG. 1 is a schematic representation of a plasma generator of the present invention including a schematic representation of the electrical circuit used therewith;

FIG. 2 is a schematic side view of the device of the present invention showing the type of arc shape (bell shape) obtained with the forced gas flow used with the center nozzle for enhancing heat transfer to the anode;

FIG. 5 is a graph depicting typical results of operations of a device of the present invention illustrating the anode heat dissipation in the presence of an anode jet dominated mode of operation as shown in FIG. 3, and illustrating the transition to a forced gas and cathode jet dominated mode of operation as shown in FIG. 2 at two arc lengths, which illustrates the type of attachment of an arc to an anode at a standard current of 100 amps and at different gas flows.

DETAILED DESCRIPTION OF THE PREFERRED EMBODIMENTS

Figure 4:
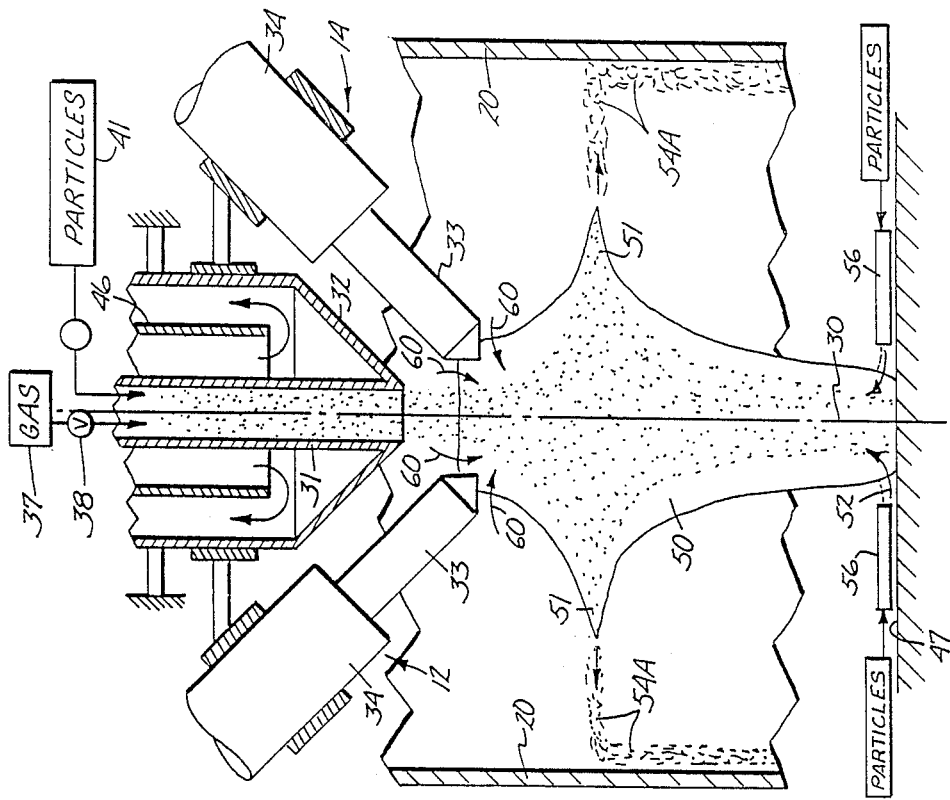
FIG. 4 is a representation of the configuration of FIG. 3 illustrating particulate processing when particles are injected through forced gas nozzles at both the anode and cathode ends of the plasma column.

Referring to FIG. 1, plasma forming means are indicated generally at 10, and in the form shown include an anode 11, and as shown in the preferred embodiment, a plurality of cathodes 12, 13 and 14 spaced from the anode a desired distance, and supported in a suitable manner (not shown). These can be supported in a frame that is suitably cooled, if necessary, and placed within the confines of a furnace, for example having walls indicated schematically at 20.

In the form shown, a power supply 21 provides power to anode 11 through a line 22 and shunt current resistor 23, and then to anode 11. Each of the cathodes 12, 13 and 14 is connected to the negative terminal of the power supply 21 through a line 26, shunt current resistor 24, and stabilizing resistor 25, in series with the resistor 24. Cathodes 12, 13 and 14 are connected in parallel through line 26 to the negative side of power supply 21.

The above identified electrical arrangement provides adequate stabilization of current flow for establishing an arc. The shunt current resistors provide a means of measuring current flow to monitor the operation of the device.

In use, the arcs are generally initiated using a high frequency spark at very close gaps, after which the cathodes can be moved away from the anode a desired amount to obtain the desired gap length.

The anode 11 preferably is copper or other suitable material. For use in a plasma reactor it can be water cooled to prevent it from being consumed or evaporated during operation. However, with a different anode configuration than that shown in FIG. 1, it is possible to maintain an uncooled molten anode inside a crucible. It is also possible to produce a coating on a substrate moving in the lateral direction which serves, at the same time, as an anode.

In the preferred form the three cathodes 12, 13 and 14 are positioned 120° apart around a central axis 30 at an included angle along the longitudinal axes of the cathodes of substantially 45°, as shown in FIG. 1. The central axis 30 is through the center of the anode 11, and the tips of the cathodes 12, 13 and 14 are spaced at a desired distance apart.

A gas nozzle indicated generally at 32 is centered along the central axis 30 and positioned in front of cathode 13. As shown in FIG. 2, nozzle 32 has a central opening 31 through which suitable inert or reactive gases can be directed down into the core of the plasma formed.

As shown in FIG. 2 in this form of the invention the cathodes 12, 13 and 14 include suitable cathode holders or supports 34 and cathode tips 33. An arc is formed between the cathodes and the anode 35. For clarity, cathode 13 is not shown but is understood to be positioned behind nozzle 32 as shown in FIG. 1. The plasma column 39 formed by the arc is controlled and stabilized by providing a flow of gas through the central opening 31 of the nozzle 32 from a gas source 37 at a desired flow rate controlled by a valve 38. Valve 38 may be any suitable valve which permits varying the rate of gas flow. An inert gas such as argon may be used, and this will form a core 40 of material generally as outlined in the dotted lines. The arcs from each of the cathodes 12, 13 and 14 will coalesce approximately one-third of the way from the cathodes to the anode 35, the exact location depending on system parameters including cathode/anode geometry, current flow, and forced gas flows, in the bell-shaped form shown to broaden out the area of contact of the arc on the anode. The coalesced arcs form the plasma column 39. The jet of gas coming from the nozzle 32 tends to stablize the plasma column 39 and keep it from dancing back and forth on the anode 35 as the arc is generated. The gas flow from the nozzle 32 will counteract the induced gas flow from the anode 35 toward the cathodes 12, 13 and 14, commonly known as the anode jet, and will assist or add to gas flows from the cathodes 12, 13 and 14 to the anode 35, called the cathode jets.

In the form shown in FIG. 2, the bell shaped end 39A of the plasma column 39 is obtained by having sufficient gas flow from the nozzle 32 along the core 40 of the plasma column 39 to overcome self-induced anode jets moving in direction from the anode 35 toward the cathodes 12, 13 and 14, and provide a net positive flow from the cathodes 12, 13 and 14 to the anode 35. This gas flow then spreads out along the surface of anode 35, forcing the plasma column to also spread. This results in the wide base of the plasma column which permits higher power arcs and hence greater heat transfer without forming an extremely hot, localized point contact of the arc to the anode 35 which would cause excessive vaporization of the anode material. The gas flowing from nozzle 32 may be inert for simple melting and/or vaporizing processes (e.g. coating, spheroidization, etc.) or may be reactive for chemical transformations (e.g. reduction, coal gasification etc.)

If desired, particles (particulate matter) from a particle source indicated at 41 can be intermixed with the gas from the gas source 37. This particulate matter is thus injected into the plasma column 39 and is passed down through the column core 40, to intermix with the plasma and chemically react, or be heated in a desired manner. The particles can be carried in a gas stream from the source or dispersed in any suitable manner. If desired, the particles can be processed in the plasma column 39 and then either deposited as a coating on the material forming the anode 35 in the approximate area of contact between the plasma column and the anode or ejected as shown by arrows 42.

Thus, injecting a suitable column of gas along an axis positioned between a plurality of cathodes stabilizes the plasma column, and adjusting the flow of such gas diffuses the plasma column at its base where it contacts the anode to provide a bell shaped, wide area of contact between the plasma and the anode. In the form of the invention shown in FIG. 2, the self-induced flow of gases from the anode to the cathodes that would occur in the case of a constricted plasma column at the anode is overcome by the flow of the gas from the nozzle 32, augmented by the self-induced flow of gas from the cathodes to the anode. The flow from nozzle 32 can be adjusted with valve 38 between the gas source and the nozzle 32 to provide the desired bell shape.

As shown, the nozzle 32 is a water cooled sleeve having a partition tube 46 surrounding the annular center tube 31, and the flow of water would be cool along the walls forming the center tube 31. The water flows back out along the outer walls of the nozzle to keep the nozzle material from deteriorating in the high temperature environment of the furnace.

The same type of results can be obtained using a core gas flow for stabilization of plasma torch flows, if the cathodes are replaced with plasma torches. The anode 35 would remain an anode and the plasma jets from the torches would be flowing toward the surface of the anode 35. Thus, the plasma torches would be operating in the transferred arc mode, where the anodes of the torches are electrically disconnected after arc initiation. The use of a center inert gas core stabilizes the plasma flow, and provides for a wider area of contact of the plasma to the anode as well as providing the ability to control processing of particles from a source by having better control of the time for processing and the temperatures.

Figure 3:
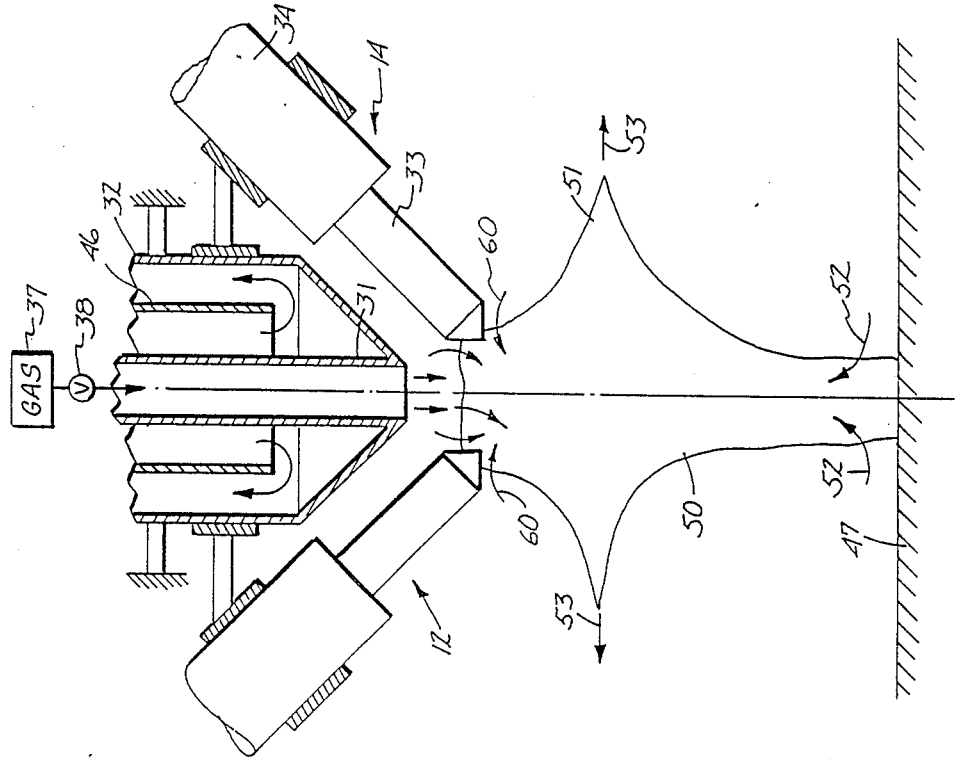
FIG. 3 is a representation of the device of the present invention showing the effects of reduced forced gas flow that provides a stagnation area in the plasma column between the anode and cathode for plasma reactor use.

In FIG. 3 a form of plasma column particularly useful for plasma processing is shown which can be obtained by regulating the gas flows through the valve 38. Again in FIG. 3, cathode 13 is not shown, but is positioned behind nozzle 32. Self-induced gas entrainment from the anode 47 occurs, as previously mentioned, without a flow of gas from the nozzle 32, so that there will be a convective effect upward from the anode 47 toward the cathodes 12, 13 and 14 forming an "anode jet" indicated at 52. The anode jet can dominate the plasma flow and even result in the plasma column extending upwardly above the ends of the cathodes 12, 13 and 14 in a direction away from the anode 47. However, with the nozzle 32 in operation and the gas flow adjusted to a desired level, the plasma column indicated in this form of the invention at 50 will not extend above the ends of the cathodes. The anode 47 will be water cooled in a conventional manner for use in the apparatus of FIG. 3, which forms a plasma reactor. In the operating mode shown in FIG. 3, gas flows from nozzle 32, augmented by the cathode jet flows shown at 60, counteract the anode jet shown at 52. Where the flows meet, a stagnation area is formed and the gas flows radially outward into the surrounding atmosphere in the furnace. This results in an annular disk of plasma positioned between the ends of the cathodes 12, 13 and 14 and the anode 47, for example in the disk-like stagnation zone indicated at 51. Essentially what occurs is that the forced gas flow from the nozzle 32 combined with the flow of the cathode jets 60 oppose the anode jet gas flow indicated by the arrows 52. Where the pressures equalize stagnation zone 51 results, causing an outflow of gases indicated by the arrows 53. This outflow is directed radially outward from around the circumference of the plasma column 50. The stagnation zone 51 may be moved axially in relation to the cathodes 12, 13 and 14 and anode 47 as desired by adjusting the parameters of operation including cathode/anode geometry, current flow, and forced gas flow. As used, the primary means of controlling the location of the stagnation zone is through adjusting valve 38 to change the forced gas flow through nozzle 32. While in this mode of operation there is a small area of arc contact on the anode that causes localized heating, the anode is additionally cooled by the self-induced anode flow 52 along the anode surface.

In the case where it is desired to use the device as an arc plasma reactor for chemical processing of fine powders, the arrangement shown in FIG. 4 can be used to process particulate matter 54. Particulate matter from a particle source 41 is introduced into the gas flow in the nozzle 32 and is thereby carried down into the plasma column 50. At the same time small amounts of gas from self-induced flow at the anode will be moving upwardly as previously explained. Additional particles can be injected into the anode jet gas flow 52 from the anode to cathode with nozzles indicated at 56 lying parallel to the surface of anode 47. These additional particles then will move up into the plasma column 50 along with the self-induced anode jet flow so that the center core of the plasma column will be filled with particles 54 as illustrated in FIG. 4. The particles 54 then will be capable of being processed by the plasma for a period of time that is longer than that which is possible without the stagnation zone 51 generated by the forced gas flow from nozzle 32 in combination with the cathode jets 60 and anode jet 52. The process is used to cause the particles to change in character, for example, forming spheres from irregularly shaped particles. Additional chemical reactions can take place or the particles can be broken into fine powders depending on the reaction with the plasma column. Further, the side walls 20 of the furnace will be bombarded with the processed particles 54A and may be used to collect the materials being processed, utilizing both the forced gas flow from the nozzle 32 and the natural pumping action of the plasma column 50.

The particulate material is injected into the plasma column 50 by the pumping action of either 15 or both the cathode jets 60 and anode jet 52, aided by the forced gas flows in nozzles 32 and 56. These pumping actions and forced gas flows overcome the effect of the high temperature gradients, as well as the high viscosity of the plasma, which otherwise inhibit the injection of particles. The geometry of the multiple cathode arrangement as shown in FIG. 4 also enhances the injection of particles by feeding particles into a region where they are constrained by the noncoalesced plasmas resulting from the individual cathodes and hence are injected into the coalesced plasma core. The pumping action also permits feeding particles in both directions from the cathode and the anode, and the processed product is ejected radially at the stagnation region.

When desired, the heat dissipated at the anode can be made to increase significantly where there is a diffused bell attachment of the arc or plasma column, such as that shown in FIG. 2. Also, by controlling the forced gas flow from nozzle 32 the stagnation region or disk can be formed at a chosen location above the anode.

In FIG. 5, heat transfer to the anode in presence of an anode jet is plotted for two different arc lengths. One is a relatively short 5 millimeter arc length, and the other is a 40 millimeter arc length. Using the triple cathode arrangement with a current of 100 amps through each cathode, it can be seen that at a forced gas flow from nozzle 32 in the range of 14 grams per minute, and an arc length of 40 millimeters, there is a pronounced shift in the heat dissipation. The approximate location of the change from spot attachment of the arc (anode jet dominated) to bell shaped attachment (forced gas and cathode jet dominated) is indicated on FIG. 5.

At shorter arc lengths, such as 5 millimeters, a forced gas flow from nozzle 32 in the range of 10 to 12 grams per minute resulted in a change from the spot attachment of the plasma column to the anode, as shown in FIG. 3, to a diffused bell-shaped attachment, as shown in FIG. 2. Again, a reasonable arc length is desired, and the voltage levels at 100 amps current ranged from approximately 13 volts for the five millimeter arc length, to about 30 volts for the longer arc length of 40 millimeters. At arc lengths between these extremes the voltage is also between these values, and varies somewhat. Generally speaking, the shift from the spot attachment to the diffused bell type of attachment caused a shift in heat dissipation that was discernable and occurred at forced gas flows between 10 and 14 grams per minute from the nozzle 32. This is with the current and voltage shown, and the triple cathode arrangement.

As shown in FIG. 5, at shorter arc length the stagnation region is formed at lower gas flows. The gas flows can be adjusted to obtain the desired results for a given arc length and a given arc current. Current also can be varied as desired to obtain the desired attachment point.

The labeling for the respective curves in FIG. 5 shows that the heat flow to the anode commences to go up as the anode attachment area increases, and that the diffused bell attachment causes higher heat flows to the anode.

Figure 6:
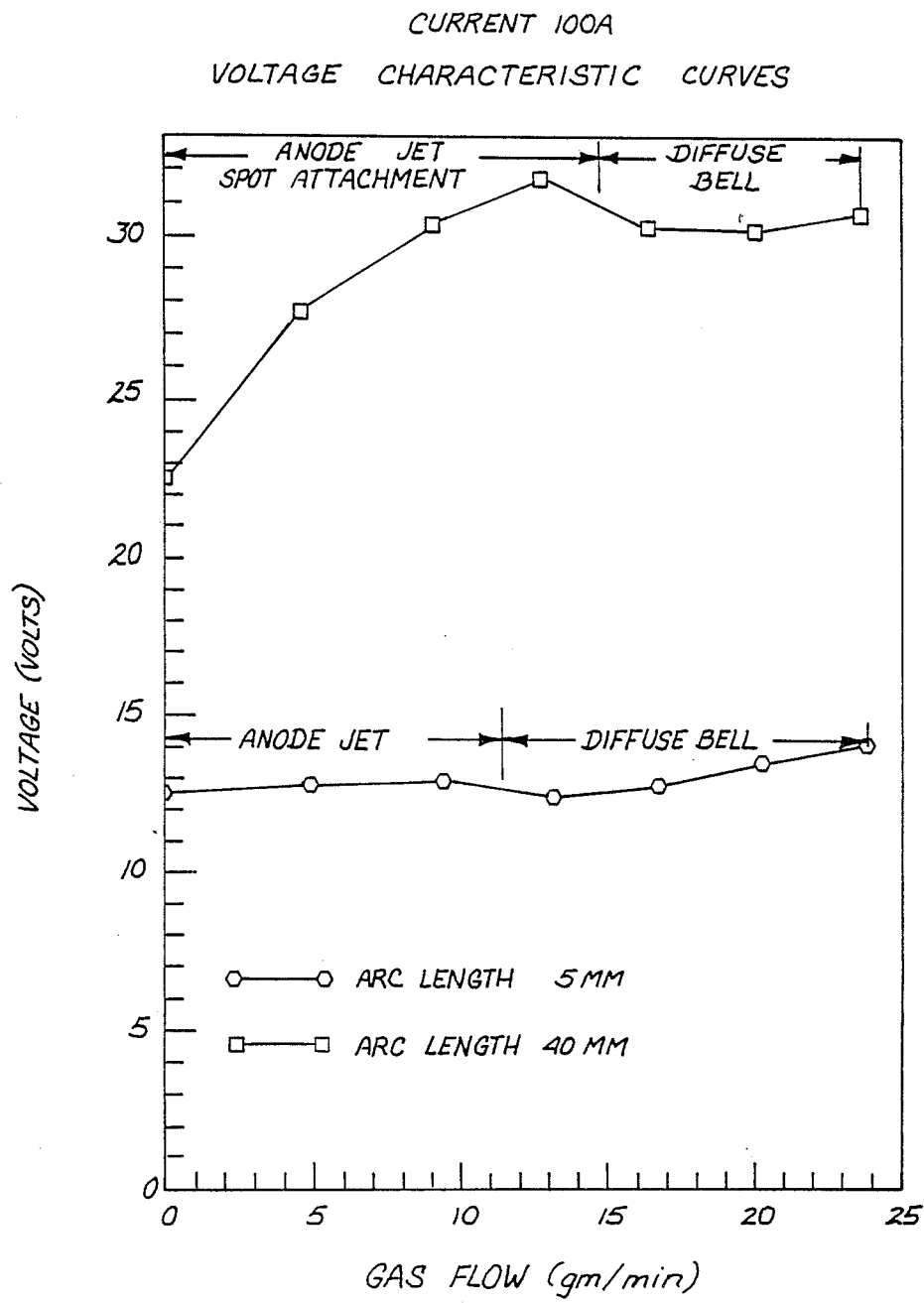
FIG. 6 is a graph representing the voltage characteristics of a device of the present invention at two different arc lengths, and at varying gas flows, plotting the voltage versus the gas flow with a standard current of 100 amps.

FIG. 6 is a graph generally illustrating the effect of various gas flows from the nozzle 32 on the voltage levels to maintain a current of 100 amps to each of the cathodes. This shows the various voltage levels that are produced by the conditions illustrated in FIG. 5, in presence of an anode jet, at particular currents for two different arc lengths and shows the approximate region, as marked on FIG. 5, of formation of the diffuse bell attachment to the anode at different gas flows.

Experiments have shown that with a triple cathode the voltage will vary as current is changed. When the current increases into the range of 80 amps, the arcs will coalesce and form one large arc column, as mentioned. The cold gas from the nozzle 32 will penetrate the plasma in the center, and will tend to cool the plasma in the core. This, however, has little effect on the arc conductance, and the arc voltages remain fairly stable from about 80 amps and higher in experimentation. Further, each of the cathodes draws substantially the same current, particularly where there is a coalesced arc.

With the invention it has been found that the greater the arc length, the higher the voltage. With a cathode jet and forced gas dominated mode of operation, that is, with gas flows in nozzle 32 sufficient to overcome the anode jet, the optimum operating point, where the three arcs merge together and where the energy dissipation is also the lowest, generally is in the range of 80 to 100 amps and at a low voltage point. In this mode of operation the diffuse bell attachment occurs. The injected particles, when such particles are injected, will be best entrained into the hot plasma core at the point where the arcs coalesce.

The use of the three cathodes adds stability to the coalesced arc, and provides for a large plasma volume through which the particles may pass for treatment.

The arc voltage generally increases with increasing forced gas flow rate from nozzle 32 at each arc length. As the gas flow from the nozzle 32 increases, the cooling effect on the plasma becomes stronger. This cooling of the plasma increases the resistance of the arc and the arc voltage must rise to compensate. The voltage characteristics, generally speaking, of the triple cathode arc are similar to those found in conventional single cathode arcs, and because the forced gas from the nozzle 32 acts as an artificial cold cathode jet, the forced gas aids in the stabilization of the arc.

In the anode jet dominated mode of operation, before the diffuse bell attachment occurs, the flow from the anode to cathode causes the disk of plasma at the stagnation region 51 spaced from the anode. In FIG. 5, the anode jet dominated mode is indicated at low gas flows for the different arc lengths shown there, and the diffused bell attachment of the anode occurs where the greatest amount of heat is shown to be dissipated for a given amount of power. It should be noted that for some limited values of current, voltage, and distance of cathodes, the stagnation zone 51 shown in FIGS. 3 and 4 occurs as a result of the cathode jet alone without forced gas flow through nozzle 32; however, the flow through nozzle 32 allows creation of the stagnation zone for a much greater range of current, voltage, and distance of cathodes and in any event provides for greater control over the creation and location of the stagnation zone. The forced gas flow through nozzle 32 under typical operating conditions is approximately five times higher than the self-induced flow of the cathode jets.

The presence of a self-induced cathode jet 60 depends in part upon the shape of the cathode tip. If the cathode tip is blunt, rather than a fine or sharp tip, the cathode jet is reduced and it is possible to operate in an anode jet dominated mode where the anode jet is in the full reverse flow. An anode jet flow, in the opposite direction of the electron flow, aids the positive ion flow. When the anode jet is forced downward toward the anode by the combination of the forced gas flow and cathode jets, the flow favors the electron flow, resulting in lower arc voltages. When an anode jet, and a flow in the reverse direction are impinging upon each other, a high potential drop is needed to push the particles through the stagnation layer.

The anode jet hinders heat transfer to the anode as a result of the flow along the anode and up through the plasma column. Thus, from the view point of heat transfer to the anode, the anode jet mode should be avoided, and as shown in FIG. 5, for example, a sufficient flow of gas from the cathode should be provided through the central core to provide the diffuse bell attachment to the anode. However, when the flows are in the anode jet mode, and the forced flow through the nozzle 32 is selected to form a stagnation zone, the ability to inject particles at both the anode and through the central nozzle is present, and the processing of the particles in the stagnation zone at the plasma provides for greater length of time of particle processing, higher heats, and in many instances greater efficiency. The introduction of the forced gas down the central axis between the cathodes at a controlled rate provides a very stable arc under all conditions, and at selected forced gas flows will increase the anode heat transfer, and at other (lower) forced gas flows can create a stagnation zone between the anode and cathode which results in enhanced conditions for processing of particulate matter. Thus, the flows from nozzle 32 for obtaining the operating mode shown in FIGS. 3 and 4 will be below the flow that causes bell attachment shown in FIG. 2.

Varying the current provides an additional means of control over the formation and location of the stagnation zone. Lower currents reduce the intensity of the cathode jets and hence will allow the stagnation zone to move somewhat closer to the cathodes; however, as noted above, the effect of the cathode jets are significantly less than the effect of the forced flow of gas.

The position of the stagnation region can be adjusted by regulating the pressure through the cathode forced gas nozzle 32, as well as the anode forced gas nozzles 56.

The carrier gas used for injection of particulate matter into the arc may be inert or it may represent a chemical reactant depending on the desired reaction in the plasma.

This device may be used for physical as well as for chemical processing. Physical processing may, for example, include spheroidization of irregularly shaped powder particles, production of ultrafine powders (for example silica) and densification of conglomerates. Chemical processing includes the decomposition of compounds (for example toxic wastes), the synthesis of carbides, nitrides and refractory metal oxides, the production of chemical compounds and alloys using solids, liquids or gases as starting materials.

Radial ejection of the products from the hot plasma zone provides for a fast quench of the products which may be further enhanced by impingment of the products on water cooled walls or by entrainment of the products into water cooled channels.

The injection nozzles 56 project radially from the axis of the plasma column, and perhaps six or so equally spaced nozzles would be used around the axis. The particles from nozzles 56 will generally be conveyed in a gaseous fluid in a known manner.

While the device will work with only one cathode, the use of three cathodes provides for better control and better action. The device will also work with modifications including the height of the gas nozzle relative to the cathode tips, the rotation of the entire multiple arc plasma torch assembly in any direction, and different anode geometries such as stick anodes, ring anodes, or anode crucibles. In a preferred embodiment of this invention, the particle injection occurs at a point equal to or below the cathode tips to prevent cathode degradation.

Although the present invention has been described with reference to preferred embodiments, workers skilled in the art will recognize that changes may be made in form and detail without departing from the spirit and scope of the invention.

What is claimed is:

1. An apparatus for plasma processing comprising means forming a plasma column directed toward a surface comprising a plurality of substantially equally spaced sources of plasma arranged annularly around a central axis, which sources coalesce to form the plasma column, a source of a gas under pressure, a nozzle for directing gas flow from the source, the nozzle having a flow axis substantially coinciding with said central axis and the flow being directed in the same direction as the flow of plasma from the sources of plasma, said nozzle being in a region adjacent the sources of plasma and where the plasma has not coalesced, and means for regulating flow of gas from the source through said nozzle to provide a gas flow sufficient to stabilize and control the configuration of the plasma column formed.

2. The apparatus of claim 1 wherein said means forming a plasma stream comprises at least three cathodes substantially equiangularly displaced about the Central axis forming an arc with respect to an anode, said anode comprising said surface toward which the plasma column is directed.

3. The apparatus of claim 1 wherein air means forming a plasma column comprises three sources of plasma arranged about the central axis at substantially 120° relative to each other.

4. The apparatus as specified in claim 1 wherein the surface is a heat dissipation surface, and said means for regulating flow of gas from the source is adjusted to cause the gas flow in direction form the sources of plasma toward the surface to be the dominant flow on the interior of the plasma column, and to cause the column to spread out over an area of said surface substantially larger than the area of the plasma column for the majority of its length above the surface.

5. The apparatus as specified in claim 3 wherein said means forming a plasma column comprise an anode having said surface, and three cathodes spaced form said anode a desired amount to provide an arc and to create a self-induced flow of gas from the anode toward the cathode, said means for regulating flow of gas providing a flow of gas through the nozzle tending to overcome the self-induced gas flow to form a stagnation zone in the column spaced from said surface of said anode, and also spaced from said cathodes in direction toward aids anode.

6. The apparatus as specified in claim 5 wherein said cathodes are spaced from said anode a distance so that the arcs formed coalesce to form a single plasma column, and said nozzle directs a flow of gas through the center of the coalesced arcs, the gas flow through said nozzle being adjusted to provide a disk of plasma spaced from the anode, and also spaced, from the cathodes and radiating from the coalesced arc, and surrounding the rest of the plasma column, and means for providing particles to said gas flow whereby said particles are discharged outwardly around said disk with the gas from said nozzle.

7. The apparatus as specified in claim 2 wherein the cathode and anode are positioned and said flow of gas is adjusted to permit the arc to operate in an anode jet dominated mode, with flow of gas from the anode toward the cathode, and the flow of gas from said nozzle opposes the anode jet to form a discharge disk of plasma through the column of plasma between the cathode and the anode, and means to inject particles into the gas carried through the nozzle, and also into the anode jet flow.

8. An apparatus for processing particles utilizing a plasma column directed in a first direction comprising:
    a plurality of cathodes mounted to be spaced laterally from a central axis and being spaced annularly from each other and at a substantially equal distance from the central axis;
    an anode spaced from the cathodes in the first direction along the axis, said cathodes each being substantially equal distances from the anode;
    means energizing the cathodes to simultaneously form individual arcs from each cathode, said cathodes being spaced from the central axis so that the individual arcs coalesces to form a plasma column extending to the anode;
    a source of gas under pressure;
    a nozzle connected to receive a flow of gas from the source and being positioned relative to the cathodes such that the nozzle is in a region where the plasma arcs forming the plasma column have not coalesced, the nozzle having a flow axis substantially coincident with the central axis and providing a gas flow toward the anode;
    means for regulating the flow of gas from said nozzle to form a stable gas core in the plasma column that is formed after the arcs have coalesced, and to control the stability of the plasma column primarily by the gas flow from the means for regulating; and
    a source of particles to be processed connected to the nozzle to add particles into the regulated gas flow coming form the nozzle to move with the regulated gas flow in the first direction from the nozzle axially in the center portions of the plasma column, said particles being carried into the central core of the plasma column with the regulated gas flow from the nozzle.

9. The apparatus as specified in claim 8 wherein said means for regulating the gas flow controls the plasma column to have a wider portion at a location between the cathodes and the anode, at least portions of said particles thereby being discharged radially out from the plasma column with gas flow at the location of the wider portion.

10. The apparatus as specified in claim 9 and a second source of particles provided at said anode, said anode defining a surface along which an induced gas flow is formed into the plasma column, and said second source of particles providing particles in said induced gas flow.

* * * * *

UNITED STATES PATENT AND TRADEMARK OFFICE
CERTIFICATE OF CORRECTION

PATENT NO. : 4,818,837

DATED : April 4, 1989

INVENTOR(S) : Emil Pfender

It is certified that error appears in the above-identified patent and that said Letters Patent is hereby corrected as shown below:

```
Column 11, line 47, delete "Central", insert --central--.
Column 12, line 6, delete "aids", insert --said--.
Column 12, line 41, delete "coalesces", insert --coalesce--
Column 12, line 58, delete "form", insert --from--.
```

Signed and Sealed this

Twenty-eighth Day of November 1989

Attest:

JEFFREY M. SAMUELS

*Attesting Officer*    *Acting Commissioner of Patents and Trademarks*